United States Patent [19]

Wine

[11] 4,361,907
[45] Nov. 30, 1982

[54] DIRECT ACCESS CHANNEL SELECTION APPARATUS FOR A DIGITAL TUNING SYSTEM

[75] Inventor: Charles M. Wine, Princeton, N.J.

[73] Assignee: RCA Corporation, New York, N.Y.

[21] Appl. No.: 177,914

[22] Filed: Aug. 14, 1980

[51] Int. Cl.³ .......................... H04B 1/16; H03J 7/20
[52] U.S. Cl. .................................... 455/160; 455/166; 455/186
[58] Field of Search ............... 455/160, 161, 165, 166, 455/168, 179, 184, 185, 186

[56] References Cited

U.S. PATENT DOCUMENTS

| | | | |
|---|---|---|---|
| 3,942,121 | 3/1976 | Bell et al. | 455/160 |
| 3,946,319 | 3/1976 | Ma et al. | 455/184 |
| 4,031,474 | 6/1977 | Ehni et al. | 455/186 |
| 4,123,713 | 10/1978 | Wine | 455/186 |
| 4,123,715 | 10/1978 | Fathauer | 455/160 |
| 4,164,711 | 8/1979 | Steckler et al. | 455/186 |

*Primary Examiner*—Jin F. Ng

*Attorney, Agent, or Firm*—E. M. Whitacre; P. J. Rasmussen; P. M. Emanuel

[57] ABSTRACT

In a channel selection arrangement including scanning apparatus for causing the next channel after a presently selected channel to be selected when activated and skipping apparatus for automatically activating the scanning apparatus when the selected channel is not in a group of preferred channels, apparatus which allows a viewer to directly select a channel by the operation of a single respective switch element is provided which makes advantageous use of the scanning and skipping apparatus. Specifically, the direct channel selection apparatus includes a plurality of switch elements associated with respective decimal numbers which may be allocated to ones of the preferred channels having corresponding ordinal numbers and scan activation apparatus responsive to the operation of one of the switch elements for causing the scanning apparatus to be activated a number of times related to the decimal number associated with the operated switch.

11 Claims, 4 Drawing Figures

DIRECT ACCESS CHANNEL SELECTION APPARATUS FOR A DIGITAL TUNING SYSTEM

The present invention relates to channel selection apparatus for a digital tuning system including a plurality of channel selection devices each for uniquely selecting a respective channel.

A variety of channel selection arrangements for digital tuning systems are known. Generally, they may be classified as being one of three types: scanning, digit entry and direct selection. In scanning arrangements at least one scanning switch is provided for causing the range of available channels to be scanned in a predetermined direction until the desired channel is reached. In digit entry arrangements, a calculator-like keyboard is provided for entering the digits of the channel number or frequency of the desired channel. Direct selection arrangements include a plurality of switches each of which is associated with a respective channel. The direct selection type has advantage over the digit entry type in that it only requires the operation of a single switch to select a channel and has advantage over the scanning type in that it in general takes less time to select a channel.

In scanning type channel selection arrangements a memory including a memory location for each of the available channels is provided so that undesired channels may be skipped during scanning thereby speeding channel selection. Each memory location contains a single binary digit (bit) or signal having a first level when the respective channel is to be skipped and a second level when the respective channel is not to be skipped. As scanning occurs, locations are addressed and respective channels are either skipped or tuned depending on the level of the stored binary signals.

The present invention concerns a direct channel selection arrangement which makes advantageous use of the channel skipping apparatus employed in a scanning type channel selection system for causing non-preferred channels to be bypassed and only preferred channels to be selected in a sequential order. More specifically, the present invention includes a plurality of switch elements each associated with a respective cardinal number to which preferred channel may be allocated in corresponding ordinal number sequence; and apparatus for changing the channels from one preferred channel to the next upon the activation of a switch element a number of times corresponding to the cardinal number associated with the activated switch element. In a preferred embodiment, the present invention includes scan activation apparatus, which upon the activation of a switch element, causes the activation of the scanning apparatus of the channel selection system to select sequential channels. As the scanning occurs, the channel skipping apparatus causes the non-preferred channels to be automatically bypassed. A change counter counts the number of times the scan activation apparatus has caused the channel to be changed. A comparator determines when the cardinal number of the activated switch element and the number of change commands have a predetermined relationship and then causes the scan activation apparatus to stop causing the channel to change. At this point, the preferred channel allocated to the activated switch element has been selected to be tuned.

The present invention will be described with reference to the accompanying drawing in which.

Figure 1:
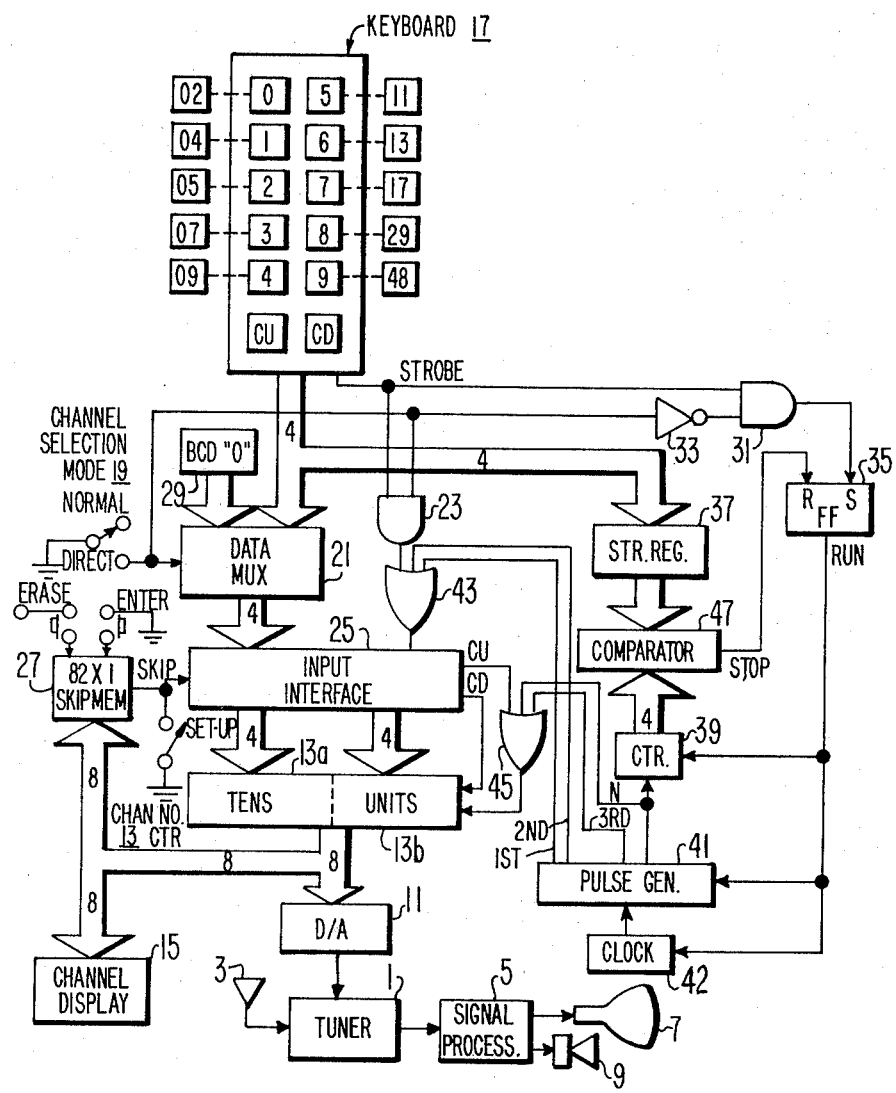
FIG. 1 is a schematic in block form of channel selection system for a television receiver employing an embodiment of the present invention as it may be constucted from discrete logic elements.

In FIG. 1, a television receiver includes a tuner 1 for selecting one of a plurality of RF carriers associated with a respective selected channel received from an Rf source, shown illustratively as an antenna 3, and converting the selected channel to an IF signal. Picture and sound components of the IF signal are processed in a signal processing section 5 of the television receiver to produce picture and sound responses by means of a picture tube 7 and a speaker 9, respectively.

Tuner 1 tunes the receiver to the RF carrier associated with the selected channel in accordance with the magnitude of a tuning voltage. The tuning voltage is generated by a digital to analog converter unit 11 in response to coded binary signals representing the channel number of the selected channel stored in a channel number counter 13. Converter unit 11 may, for example, comprise a phase locked loop in which the binary signals stored in channel number counter 13 control the division factor of a programmable divider. A channel number display unit 15 displays the channel number of the selected channel in response to the binary signals stored in channel number counter 13.

The binary signals representing the channel number are generated in response to user operation keyboard 17. Keyboard 17 includes ten switch elements shown in the form of pushbuttons, each for causing the generation of four binary signals in binary coded decimal (BCD) format representing a respective one of the cardinal numbers 0 through 9 when operated. In addition, when one of the pushbuttons of keyboard 17 are operated, after the BCD signals have been generated, keyboard 17 generates a STROBE signal indicating that the BCD may be processed. Assuming that a CHANNEL SELECTION MODE switch 19 is in its NORMAL position, the BCD and STROBE signals generated by keyboard 17 are applied through a data multiplexer 21 and an AND gate 23, respectively, (the latter two units having functions described below with respect to the direct channel selection aspect of the present invention) to an input interface unit 25. To select a channel, the user depresses pushbuttons of keyboard 17 corresponding to the tens and units digits of the channel number of the desired channel. Input interface unit 25 applies the groups of BCD signals representing the tens and units digit of the channel number of the desired channel to tens and units digit sections 13a and 13b, respectively, of channel number counter 13 in response to the respective STROBE signals.

Keyboard 17 also includes CU (Channel Up) and CD (Channel Down) pushbuttons for selectively causing the channel number register to be increased or decreased. When one of buttons CU and CD is operated, input interface unit 25 causes a respective pulse signal to be applied to channel number counter 13. The CU and CD pulse signals cause the contents of channel number counter 13 to be changed so that the channel number is increased or decreased, respectively, to the next channel number. When a new channel number is generated, a corresponding memory location of a skip memory 27 is addressed. Skip memory 27 includes a memory location for each channel (e.g., 82 in the United States). Each memory location stores a single bit (binary digit) SKIP signal having a first logic level, e.g., a "0" logic level, when the respective channel is one that is desired to be tuned and a second logic level, e.g., a "1" logic level when the respective channel is one that is not desired to be tuned. Desirable skip memory is non-volatile, i.e., capable of storing data in the absence of power.

The SKIP signals are applied to input interface unit 25. When a SKIP signal has the second logic level, a CU pulse is generated if the CU pushbutton was previously operated and a CD pulse is generated if the CD pushbutton was previously operated. In response, the next channel number is generated causing the undesired channel to be bypassed. This process continues until a memory location with a SKIP signal having the logic level is addressed. When this occurs neither a CU or CD pulse is generated and the channel number remains unchanged until either of the CU or CD pushbuttons is operated.

A SET-UP switch is provided by which the contents of skip memory 27 may be programmed. When the SET-UP switch is closed a "0" logic level is applied to the skip input of input interface unit 25. This permits each of the channels to be selected whether or not previously programmed to be by-passed. Each channel to be programmed is selected either by entering the two digits of its channel by use of the digit pushbuttons or by scanning to it by use of either the CU or CD pushbuttons. If the channel is to be selected for tuning, an ENTER pushbutton switch is operated thereby causing a "0" to be stored in the corresponding memory location. If the channel is to be by-passed, an ERASE pushbutton switch is operated thereby causing a "1" to be stored in the corresponding memory location.

Channel number counter 13 counts cyclically, i.e., it automatically changes from 99 to 00 as the channel number is increased and from 00 to 99 as the channel number is decreased. In the United States channel numbers 00, 01 and 84 through 99 are not allocated to broadcast channels. Channel number counter 13 includes provisions for automatically by-passing the unallocated channel numbers. This may simply be accomplished by a comparator for generating a CU or CD pulse signal, depending which one of the CU and CD pushbuttons has been depressed, whenever a channel number generated as channel number counter 13 counts in response to a CU or CD pulse signal corresponds to one of the unallocated channel numbers.

Portions of the channel selection system so far described, with the exception of data multiplexer 21 and AND gate 23, can be constructed as corresponding parts of the channel selection systems of RCA television receivers model numbers GER 730, 734, 735, 736, and 738 described in "RCA Television Service Data" File 1980 C-7 published by RCA Corporation, Indianapolis, IN. The integrated circuits for controlling channel selection employed in the above-identified television receivers are constructed to be used in either scanning or digit entry channel selection systems. The latter are described in an article entitled "Frequency Synthesis Custom LSI; The Inside Story" by H. Blatter, R. Rast and J. Tults appearing in the "IEEE Transactions on Consumer Electronics", Volume CE-24, Number 3, published August 1978.

The channel selection system so far described also includes direct channel selection apparatus by which each ten preferred channels may be directly selected by depressing a respective one of the digit pushbuttons of keyboard 17. The present direct channel direction apparatus makes advantageous use of the scanning apparatus described above.

In the direct channel selection mode, each of the ten preferred channels which are to be directly selectable are allocated to a respective one of the digit pushbuttons having the cardinal number equal to the ordinal number of the channel in a list of preferred channels arranged in ascending order. For example, assume that in a given reception area it is desired to directly select channel 02 (the "0" is the tens digit which must be entered in the digit entry channel selection mode), 04, 05, 07, 09, 11, 13, 17, 29 and 48. To set-up the channel selection apparatus for the direct selection of these channels each of a "0"logic level (i.e., the first logic level indicating desired channel) is stored in the respective memory locations of skip memory 25 as described above and a "1" logic level is stored in the memory locations corresponding to the channels between the preferred channels. Then an overlay element, e.g., with a sticky backing is placed over each of the digit pushbuttons 0 through 9 as indicated in the lower right hand corner of each digit pushbutton in FIG. 1. Finally, CHANNEL SELECTION MODE SWITCH is placed in the DIRECT position.

After MODE switch 19 has been placed in the DIRECT position, when a digit pushbutton is depressed, a number of CU pulse signals equal to the digit pushbutton are generated. This causes the selection of the preferred channel having the corresponding ordinal position in the list of preferred channels.

More specifically, with reference to the specific embodiment of FIG. 1, when CHANNEL SELECTION MODE switch 19 is in the DIRECT position, a "0" logic level, e.g., ground potential, is applied to the control input of data multiplexer (MUX) 21 and to AND gate 23. This prevents the four BCD signals and STROBE signals resulting from the depression of a digit pushbutton from being applied to input interface unit 25. Instead, in response to the "0" logic level from MODE switch 19, the following occurs: data multiplexer 21 applies four BCD signals representing the decimal number zero, generated by a unit 29, and to interface unit 25; an AND gate 31 is enabled due to the inversion of the "0" logic level from switch 19 by an INVERTER 33, to apply the STROBE signal to a flip flop (FF) 35. The latter causes FF 35 to be set thereby causing the generation of a RUN signal. In addition, the BCD signals generated when the digit pushbutton is depressed are stored in a storage register 37.

The RUN signal resets a counter 39 to a state corresponding to the decimal number zero; resets a pulse generator 41; and enables a clock generator 42 to start generating clock pulses. In response to the clock pulses, pulse generator 41 sequentially generates pulses. The first and second pulses are applied through an OR gate 43 to input interface unit 25 as psuedo STROBE signals. As a result, the BCD signals representing the decimal number 00 supplied to input interface unit 25 by data multiplexor 21 from unit 29 are entered successively into tens and units portions 13a and 13b, respectively, of channel number counter 13.

Third and subsequent pulses generated by pulse generator 41, the latter being supplied on an output level of pulse generator 41 labelled N, are applied to channel number counter through an OR gate 45 as psuedo CU pulse signals. Since channel number 00 corresponds to an unallocated channel, as described above, the contents of the channel number counter 13 are automatically increased until the first allocated channel number, i.e., 02 is reached. After channel number 02 is reached, skip memory 27 is interrogated and non-preferred channels are bypassed as described above. The psuedo CU pulses cause the contents of channel number counter 13 to be successively increased from preferred channel to preferred channel. The pulses present on the N output line of pulse generator are counted by counter 39. A comparator 47 generates a STOP signal when the contents of counter 39 are equal to the contents of storage register 37. In response to the STOP signal, FF 35 is reset thereby ending the RUN signal. In response, clock generator 43 is disabled from generating clock pulses.

At this point, the contents of channel number counter 13 have been successively changed from preferred channel number to preferred channel number in response to the psuedo CU pulse signals generated by pulse generator 43 a number of times equal to the ordinal number of the selected preferred channel number in the list of preferred channels. During this process, the non-preferred channels between the preferred channels have been automatically bypassed due to the cooperation of skip memory 27, input interface 25 and channel number counter 13. In order to ensure that all the non-preferred channels are bypassed, the period between the generation of pulses generated by pulse generator 41 is selected to be much longer than the period required to interrogate skip memory 27 and thereafter change the contents of channel number counter 13 in response to a "1" logic level SKIP signal.

It is noted that while N pulses, N being equal to the number of the digit pushbutton depressed to select the preferred channel are applied to counter 39, N+1 pulses are applied to OR gate 45 to produce psuedo CU pulses. This is so because the first digit key to which a preferred channel has been allocated corresponds to the decimal digit zero rather than one. Accordingly, the ordinal number of the selected preferred channel in the list of preferred channels is one more than N and therefore it takes one more psuedo CU pulse than N to reach the preferred channel. For example for channel 13 which is allocated to digit pushbutton 6, seven psuedo CU pulses are generated. It will be appreciated that different comparison arrangements for determining when the contents of channel number counter 13 have been changed until the selected preferred channel has been reached are possible. For example, counter 39 may be arranged to start counting at a count of one rather than zero. Similarly, comparator 47 may be arranged to take into consideration the offset between the ordinal numbers of preferred channels and the numbers of the digit pushbuttons.

Elements of the channel selection arrangement concerned with direct channel selection shown in block form in FIG. 1 may be constructed from well known logic elements. For example, data multiplexer 21 may simply comprise four AND gates, each responsive to a respective one of the four BCD signals generated by keyboard 17 and each connected to MODE switch 19.

In this case, the function of unit 29 is inherently provided when MODE switch 19 is closed in the DIRECT position since in response to an application of the "0" logic level, each AND gate generates a "0" logic level. Further by way of example, storage register 37, counter 39, pulse generator 41 and comparator 47 may comprise integrated circuit elements commercially available from RCA Corporation, Somerville, N.J., under the part numbers indicated below.

| element | part number |
| --- | --- |
| storage register 37 | CD4042 |
| counter 39 | CD4024 |
| pulse generator 41 | cascaded D-type flip-flops such as included in the CD4013 |

Figure 2:
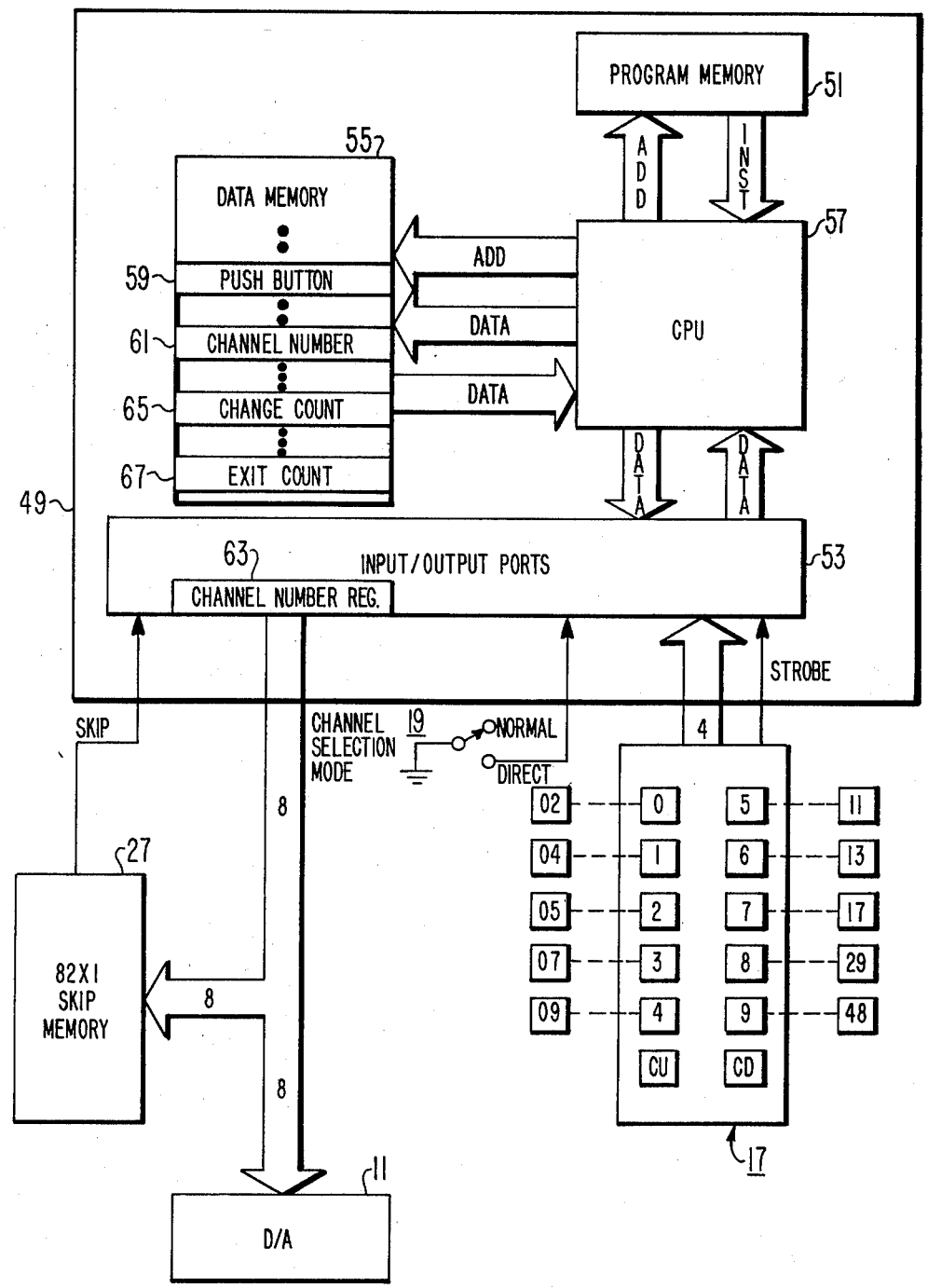
FIG. 2 is a schematic in block form of an embodiment of the present invention as it may be constructed utilizing a microcomputer under the control of a stored program.
Figure 3:
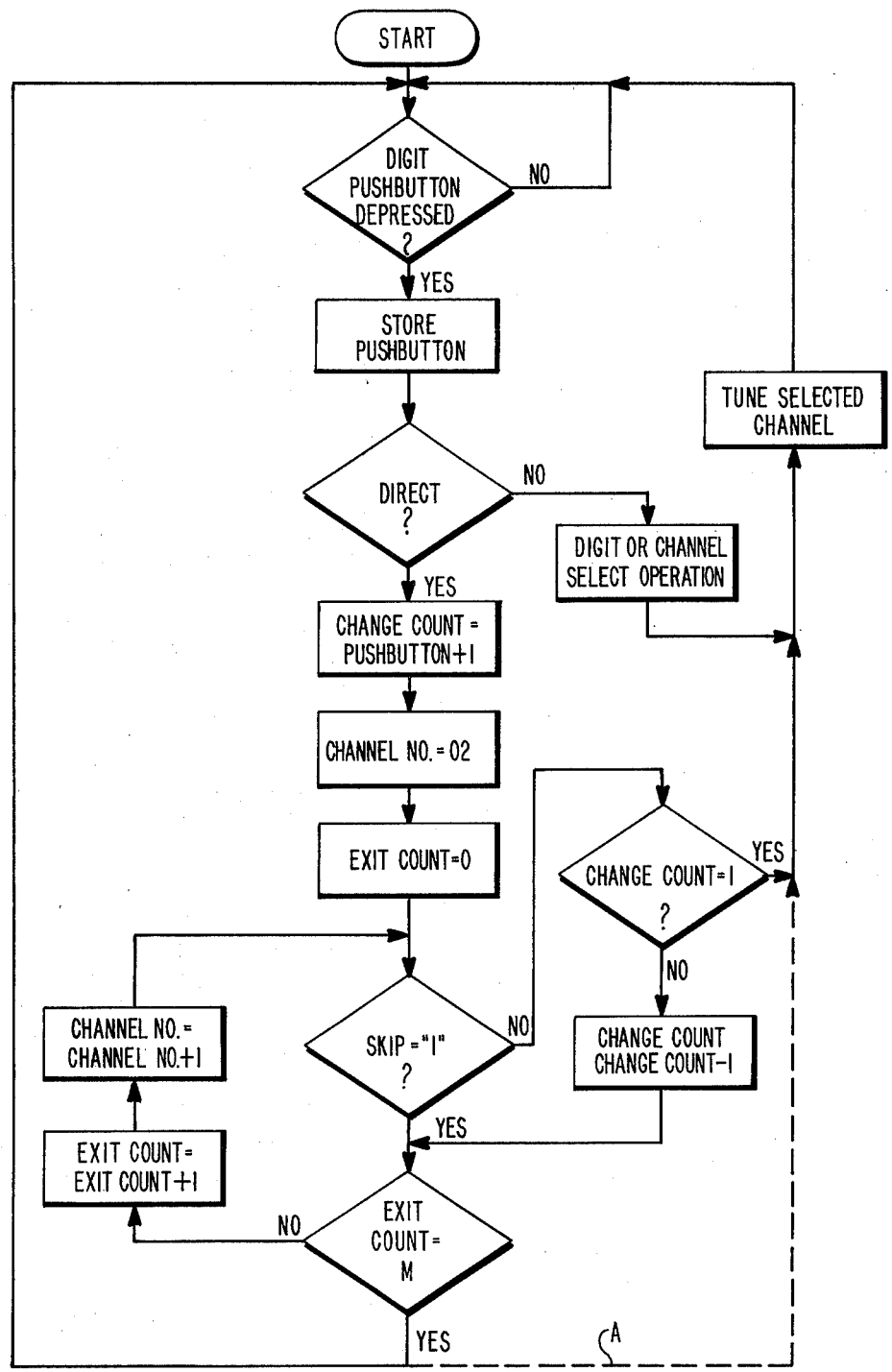
FIG. 3 is a flow chart of the stored program utilized in conjunction with the microcomputer of FIG. 2.

In the present state of the art, microcomputers and microprocessors controlled in accordance to an instruction program stored in digital form in an associated program memory have begun to replace discrete logic arrangements in digital channel selection apparatus. FIGS. 2 and 3 indicate how the present direct channel selection apparatus may be constructed utilizing a microcomputer. In FIG. 2 those elements which are similar to corresponding elements of the structure in FIG. 1 are identified by the same reference numbers.

Figure 1A:
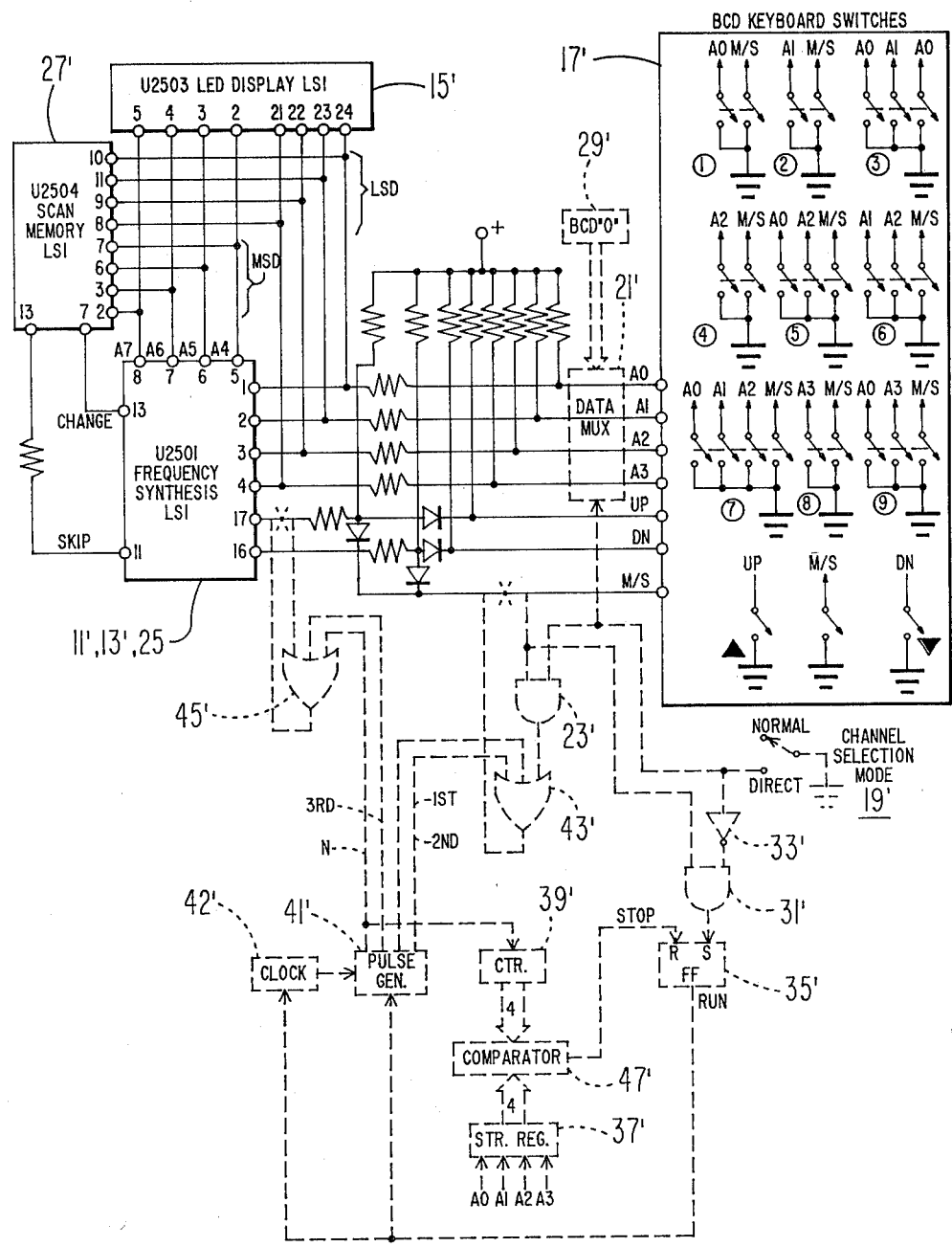
FIG. 1A is a schematic diagram indicating how the discrete logic embodiment of the present invention shown in FIG. 1 may be incorporated in a commercially available television receiver.

FIG. 1A shows portions of the channel selection system employed in the CTC-101 RCA television receiver chassis referred to above and disclosed in the RCA Television Service Data and the Blatter et al. article also referred to above. The portions shown correspond to keyboard 17, input interface unit 25, channel number register 13, D/A converter 11, channel number display 15 and skip memory 27 of FIG. 1, as indicated by the primed (') reference numbers. The heart of the channel selection system is a custom N-MOS frequency synthesis LSI integrated circuit U2501 which contains two sections. A tuner control section, including a phase locked loop, is involved with controlling the tuner, and corresponds to D/A converter 11. A control interface section is involved with controlling the tuner control section in response to user commands generated by keyboard 17' and corresponds to input interface 25 and channel number counter 13.

A bus network couples keyboard 17' to frequency synthesis LSI U2501 (11', 13' and 25') and frequency synthesis LSI U2501 to scan memory LSI U2504 (27') and to LED display LSI U2503 (15'). The bus consists of two sets of four lines. One set of four lines is bi-directional and is used to receive data from keyboard 17' and also to provide the least significant digit (LSD) of the channel number to LSIs 15' and 27'. The other set of four lines provide the most significant digit (MSD) of the channel number to LSIs 15' and 17'.

A change signal generated by LSI U2501 is coupled to scan memory LSI 27'. A "high" on the CHANGE line indicates that the bus is in the process of being changed and therefore the data on the bus is invalid.

Frequency synthesis LSI U2501 receives a SKIP signal from scan memory LSI 27'. A logic high on the SKIP line during the time the CHANGE signal is low will cause the channel number to be incremented or decremented depending on whether the UP or DN key on keyboard 17' was previously depressed.

When a key is depressed on keyboard 17', corresponding logic signals are developed on the LSD data lines A0-A3 or the UP and DN lines. In addition, each time a key is depressed an associated strobe contact pair (labelled M/S) is closed. The resultant strobe (M/S) signal causes both the UP and DN lines to be pulled to ground simultaneously. As is shown in FIG. 1A, this is accomplished by diodes connected between the M/S line and the UP and DN lines. After the first M/S signal is generated, the data on the LSD lines is entered into a buffer register within the frequency synthesis LSI U2501 (11', 13', 25'). After the second M/S signal is generated the data in the buffer register is loaded into the tens portion of the channel number counter within the LSI U2501 and the data on the LSD lines is loaded into the units portion of the channel number counter.

The manner in which the embodiment of the present invention utilizing discrete logic shown in block-form in FIG. 1 may readily be incorporated in channel selection system of the CTC-101 RCA television receiver chassis is indicated by the portions of FIG. 1A shown in phantom. The elements shown in phantom and identified by primed reference numbers in FIG. 1A correspond to respective elements shown in FIG. 1. In FIG. 1A it is seen that as indicated in block form in FIG. 1, data MUX 21' is interposed between the BCD outputs (A0-A3) of keyboard 17' and the BCD data lines, the strobe (M/S) output of keyboard 17' is connected to an input of AND gate 23' and the output of OR gate 43' is connected to the strobe (M/S) line. In like manner, the UP signal, here directly generated by keyboard 17', is coupled to one input of OR gate 45' and the output of OR gate 45' is connected to the UP line. Since keyboard 17' produces logic "1" signals corresponding to ground potential and logic "0" signals corresponding to a positive voltage logic, elements 21', 23', 43' and 45' and the other logic elements connected to them as shown in FIG. 1 should be suitably arranged to process such logic signals.

Referring now to FIG. 2 a microcomputer 49 is a single integrated circuit which includes: a program memory 51, typically a ROM (Read Only Memory), for storing the program instructions; input and output ports 53 for receiving and transmitting data from and to external devices; a data memory 55, typically a RAM (Random Access Memory), for temporarily storing received and processed data; and a central processing unit (CPU) 57 for addressing memories 51 and 55 and for processing data in accordance with the stored program. Integrated circuits part numbers 8048 and 8021 commercially available from Intel Corporation, Santa Clara, Calif., and part number COP410L commercially available from Motorola Incorporated, Santa Clara, Calif., are suitable for use as microcomputer 49. A microprocessor differs from a microcomputer in that it is an integrated circuit typically only including a CPU, the remaining components of the microcomputer identified above being included in respective individual integrated circuits which are coupled to the microprocessor integrated circuit to form a complete arrangement. Although the present direct channel selection apparatus will be described with reference to a microcomputer, it will be appreciated that a microprocessor arrangement may also be employed.

FIG. 3 is a flow chart representing the instruction program stored in program memory 51. Referring now concurrently to FIGS. 2 and 3, microcomputer 49 awaits the depression of a pushbutton of keyboard 17. When a pushbutton is depressed to change channels, after the generation of the STROBE signal, the representative binary signals are stored in a memory location 59 allocated for that purpose in data memory 55. If CHANNEL SELECTION MODE switch 19 is in the NORMAL position a sub-routine of the instruction program for digit entry or scanning channel selection operation is initiated. In the latter sub-routine, if a digit pushbutton has been depressed, its numerical value is stored in a tens portion of a channel number memory location 61. When a second pushbutton is depressed, its numerical value is stored in a units portion of channel number memory location 61. Thereafter, the contents of channel number memory location 61 are transferred to a register 63 included in the input/output port section 53 which serves as the channel number register for storing the channel number of the presently tuned channel. In the normal channel selection sub-routine, if one of the CU or CD pushbuttons has been depressed the contents of channel number memory location 61 are changed in the respective sense and after each change transferred to channel number register 63. As in the discrete logic version of FIG. 1, non-desired channels are skipped during the scanning operation when the SKIP signals stored in corresponding memory locations of skip memory 27 have "1" logic levels. Specifically, when a SKIP signal has a "1" logic level, the contents of channel number memory location 61 are increased by one in response to "1" logic level SKIP signals and transferred to channel number register 63. This corresponds to the generation of a CU pulse signal by input interface unit 25 in response to "1" logic level SKIP signals to increase the contents of channel number counter 13 in the discrete logic structure of FIG. 1.

If CHANNEL SELECTION MODE switch 19 is in the DIRECT position, after a digit pushbutton has been depressed and its representative binary signals have been stored in pushbutton memory location 59, one is added to the number of the pushbutton and the result is stored in a memory location 65. Memory location 65 serves a similar function to counter 39 in the discrete logic structure of FIG.1, i.e., to count the number of times the channel has been changed from one preferred channel to the next preferred channel and is accordingly hereinafter referred to as change count memory location 65. One is added to the number associated with the depressed pushbutton since the number associated with the first pushbutton is zero rather than one.

In addition, after a pushbutton has been depressed when MODE switch 19 is in the DIRECT position, channel number 02 is entered into channel number memory 61. This is similar to entering BCD signals representing zero twice in succession to channel number counter 13 in response to two successive psuedo STROBE signals generated by pulse generator 41 in the discrete structure of FIG. 1. In the structure of FIG. 1, it is convenient to initialize the direct channel selection operation to start at the first possible preferred channel by entering unallocated channel number 00 since only a single group BCD signals, which are used twice, need be generated. Moreover, it is a relatively simple manner to generate BCD signals representing the number zero by disconnecting the input lines from keyboard 17. However, in the structure of FIG. 2, the tens and units portions of the contents of channel number memory location 61 can be entered by CPU 57 without successive entries. Therefore, channel number 02 is entered so as to make unnecessary the operation of bypassing unallocated channel numbers 00 and 01 as in the discrete logic structure of FIG. 1.

After channel number 02 has been entered in channel number register 63, the channel number is changed in response to "1" logic level SKIP signals until the first preferred channel is reached. At that point, if the contents of change count memory location 65 represent a count of one the preferred channel allocated to the depressed pushbutton has been selected and the channel selection process is at an end. If the change count is not equal to one, the change count is decreased by one and the channel number is increased by one. This process continues until the change count is equal to one. At this point, the channel number has been successively changed from preferred channel number to the next preferred channel number a number of times equal to the ordinal number of the selected preferred channel number and the preferred channel allocated to the depressed button has been selected. In this operation, change count memory location serves a similar function to counter 39 of the discrete logic structure of FIG. 1. CPU 57 does the comparison and therefore serves a similar function to comparator 47 of the discrete logic structure of FIG. 1. In addition, CPU 57 cooperates with channel number memory location 65 to increase the channel number until the selected preferred channel is tuned and therefore these elements correspond in function to pulse generator 41 and OR gate 45 of the discrete logic structure of FIG. 1. It is noted that since the channel number is changed from one preferred channel number to the next only after there are no more "1" logic level SKIP signals generated, the relationship between the rate at which the channel numbers are changed in response to the change count not equalling one and the rate at which the channel number is changed in response to SKIP signals need not be related as in the discrete logic structure of FIG. 1.

It is possible that there will be fewer preferred channels than digit pushbuttons. In this case there will be a group of pushbuttons which have been allocated followed by a group of pushbuttons which have not been allocated. Absent any provision to account for this condition, in the channel selection systems of FIGS. 1 and 2, in this circumstance, when an unallocated pushbutton is depressed, the same preferred channel allocated to the digit pushbutton having the same ordinal position in the group of allocated pushbuttons as the depressed pushbutton in the group of unallocated pushbuttons is selected. In other words the allocated list of preferred channels is repeated for the unallocated pushbuttons. For example, assume that the digit pushbuttons are allocated as indicated in the following table:

| Pushbutton | Allocation |
|---|---|
| 0 | 02 |
| 1 | 04 |
| 2 | 05 |
| 3 | 06 |
| 4 | 07 |
| 5 | 09 |
| 6 | 11 |
| 7 | 13 |
| 8 | none |
| 9 | none |

When digit pushbutton 8 is depressed, although it is unallocated, channel 02 will be selected. When digit pushbutton 09 is depressed, channel 04 will be selected.

Although the aforementioned repetition of allocated preferred channels when unallocated pushbuttons are depressed has been found to be acceptable, it may confuse some users. Accordingly, the channel selection system of FIG. 2 includes provisions to render unallocated pushbuttons inactive. Specifically, a memory location 67 of data memory 55 is allocated to count the total number of times the channel number is caused to change, whether in response to a "1" logic level SKIP signal or the change count not having reached 1. Memory location 67 is hereinafter referred to as exit count memory location 67 since it is utilized to exit from the search portion of the program after a digit key has been depressed for which no channel has been allocated. The contents of exit count memory location are initially set to zero when a pushbutton has been depressed in the direct channel select operation. Each time the channel number is changed, the exit count is compared to a predetermined number M which is equal to the number of channels which can be selected. For example, in the United States there are 82 broadcast channels, so M desirably is set to 82 if only broadcast channels are to be selected. If the exit count equals 82, the entire range of channels has been examined without finding a sufficient number of preferred channels to equal the number of the depressed digit key. In response, a sub-routine in which the depression of another pushbutton is awaited and therefore the last pushbutton depressed is in essence ignored. Alternately, as indicated by alternate branch A, the instruction program can be modified so that no further action is taken. In this case, since the search began at channel 02 and the channel number has been changed 82 times, the channel number is again 02 and channel 02 is tuned. Since there may be no carrier for channel 02 in a given reception area, the former operation in which the depression of an unallocated pushbutton effectively results in no action, may be preferred.

It is noted that if no preferred channel has been entered in skip memory 27, the exit features described above prevents the channel selection system from continuing to cyclically scan through the channels without the possibility of user intervention. The latter undesirable condition may otherwise occur because once the scanning sub-routine is initiated keyboard entries are ignored, i.e., the input/output ports are not examined for a keyboard entry, until a channel is selected for tuning.

It is further noted that if the program is modified so that M is equal to the number of pushbuttons which may be allocated to preferred channels, e.g., ten in the channel selection systems of FIGS. 1 and 2, times the number of selectable channels, e.g., 82 in the United States, depression of an unallocated pushbutton in a group of unallocated pushbuttons causes the selection of preferred channels allocated to pushbuttons having the same ordinal number in the group of allocated pushbuttons as described above. However, if no preferred channel has been entered in skip memory 27 when the exit count reaches M, e.g., 820, the cyclically scanning will be ended by the selection of channel 02 (assuming that the program is modified to follow alternate branch A).

It is further noted that should there be more preferred channels than digit pushbuttons, i.e., 10, the CU and CD pushbuttons may be employed while in the direct channel selection mode to scan from a directly selected preferred channel to the preferred channel for which no pushbutton exists.

While the present channel selection apparatus has been described as including only ten digit pushbuttons, other pushbuttons included on the keyboard such as the CU and CD pushbuttons may be allocated to preferred channels. Further, while the present channel selection system has been described as including a channel number channel selection arrangement whereby the digits of the channel number of the desired channel are entered, such provisions may be omitted. Still further, while the keyboard employed has been described as being of the type which generates BCD signals other types of keyboards, such as one including rows and columns of conductors in which a particular row and a particular column are connected when a respective pushbutton is depressed, may be employed. These and other modifications are intended to be within the scope of the present invention defined by the following claims.

What is claimed is:

1. In a receiver, channel selection apparatus comprising:
   channel number register means for generating, in binary form, channel numbers of respective channels in a range of channels;
   scanning control means for selectively causing said channel number register to generate the channel number next in a predetermined order after a presently generated channel number when activated;
   a plurality of switch means each for generating, in coded form, a respective decimal number when operated;
   skip means for activating said scanning control when the presently generated channel number corresponds to a channel not in a group of preselected channels; and
   direct channel selection means responsive to the operation of one of said switch means for successively activating said scanning control means a number of times related to the decimal number associated with an operated one of said switch means.

2. The apparatus recited in claim 1 further including:
   a plurality of channel number identification means for allocating channel numbers corresponding to channels in said group of preselected channels to respective ones of said number switch means so that the ordinal numbers of said channels in said group arranged with the respective channel numbers in order correspond to respective sequential decimal numbers.

3. The apparatus recited in claim 2 wherein said direct selection means includes:
   initialization means for causing said channel number register means to generate the channel number corresponding to a predetermined channel at the boundary of said range of channels initially in response to the operation of one of said switch means.

4. The apparatus recited in claim 3 wherein said direct selection means further includes:
   change counter means for generating, in binary form, a change count representing the number of times said direct selection means has activated said control means after one of said switch means has been operated; and
   comparator means for stopping said direct selection means from activating said scanning control means when said decimal number associated with said operated one of said means and said change count have a predetermined relationship.

5. The apparatus recited in claim 4 wherein:
   the channel number of the first channel in said group is allocated with the one of said switch means associated with the decimal number zero; and
   said comparator means stop said direct selection means from activating said scanning control means when said change count is equal said decimal number associated with said operated one of said switch means plus the decimal number one.

6. The apparatus recited in claim 5 wherein said direct selection means further includes:
   exit means for stopping said scanning control means from being activated until one of said switch means is again operated when the number of times said scanning control means has been activated by either of said skip means or said direct selection means a number of times equal to a multiple of the number of channels in said range.

7. The apparatus recited in claim 6 wherein said multiple is equal to one.

8. The apparatus recited in claim 6 wherein said multiple is equal to the number of said switch means.

9. The apparatus recited in claim 1 further including:
   at least one scan activation switch means for selectively activating said scanning control means when operated.

10. The apparatus recited in claim 9 further including:
    digit entry control means for causing said channel number register means to generate a channel number when ones of said switch means corresponding to the digits of said channel number are successively operated.

11. The apparatus recited in claim 10 further including:
    mode selection switch means for selectively enabling the operation of one of said direct selection means or said digit entry control means.

* * * * *